United States Patent
Sandstrom et al.

(10) Patent No.: US 6,750,972 B2
(45) Date of Patent: Jun. 15, 2004

(54) GAS DISCHARGE ULTRAVIOLET WAVEMETER WITH ENHANCED ILLUMINATION

(75) Inventors: Richard L. Sandstrom, Encinitas, CA (US); John T. Melchior, San Diego, CA (US); Rajasekhar Rao, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/173,190

(22) Filed: Jun. 14, 2002

(65) Prior Publication Data

US 2003/0016363 A1 Jan. 23, 2003

Related U.S. Application Data

(63) Continuation-in-part of application No. 10/141,201, filed on May 7, 2002, which is a continuation-in-part of application No. 10/000,991, filed on Nov. 14, 2001, which is a continuation-in-part of application No. 09/716,041, filed on Nov. 17, 2000, which is a continuation-in-part of application No. 09/854,097, filed on May 11, 2001.

(51) Int. Cl.$^7$ .................................................. G01B 9/02
(52) U.S. Cl. ................................... 356/454; 356/519
(58) Field of Search ..................... 356/73, 451, 454, 356/519, 521; 372/32

(56) References Cited

U.S. PATENT DOCUMENTS 5,978,394 A * 11/1999 Newman et al. .............. 372/32
6,359,693 B2 * 3/2002 Smith et al. ................ 356/519

* cited by examiner

Primary Examiner—Frank G. Font
Assistant Examiner—Michael A. Lyons
(74) Attorney, Agent, or Firm—William Cray

(57) ABSTRACT

The present invention provides a wavemeter for an ultraviolet laser capable of long life beam quality monitoring in a pulsed ultraviolet laser system at pulse rates greater than 2000 Hz at pulse energies at 5 mJ or greater. In a preferred embodiment an enhanced illumination configuration reduces per pulse illumination of an etalon by a factor of 28 compared to a popular prior art configuration. Optics are provided in this embodiment which reduce light entering the etalon to only that amount needed to illuminate a linear photo diode array positioned to measure interference patterns produced by the etalon. In this preferred embodiment two sample beams produced by reflections from two surfaces of a beam splitter are diffused by a defractive diffuser and the output of the defractive diffuser is focused on two separate secondary diffusers effectively combining both beams in two separate spectrally equivalent diffuse beams. One beam is used for wavelength and bandwidth measurement and the other beam is used for calibration. In preferred embodiments an etalon chamber contains nitrogen with an oxygen concentration of between 1.6 and 2.4 percent.

15 Claims, 15 Drawing Sheets

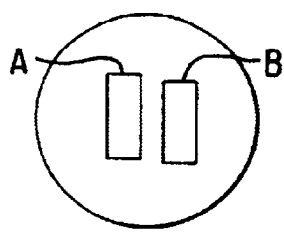
FIG. 5B1
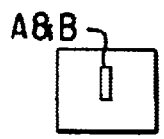
FIG. 5B5
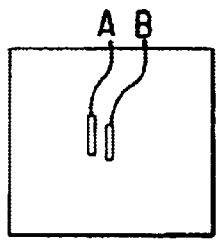
FIG. 5B2
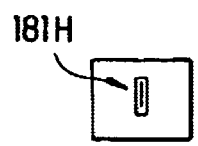
FIG. 5B6
FIG. 5B3
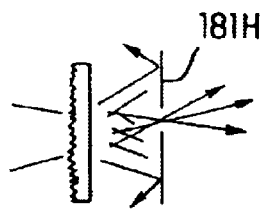
FIG. 5B7
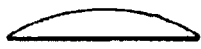
FIG. 5B4
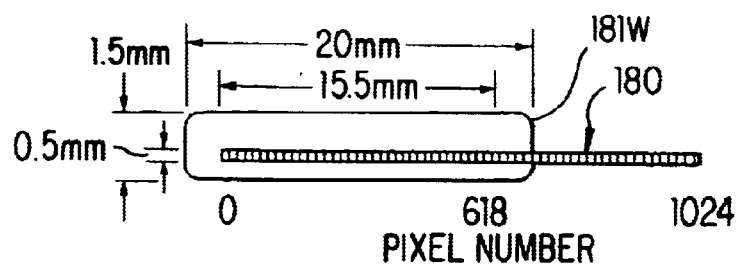
FIG. 5C

GAS DISCHARGE ULTRAVIOLET WAVEMETER WITH ENHANCED ILLUMINATION

The application is a continuation-in-part of Ser. No. 10/141,201 filed May 7, 2002, Ser. No. 10/000,991 filed Nov. 14, 2001, Ser. No. 09/716,041, filed Nov. 17, 2000, Ser. No. 09/854,097, filed May 11, 2001 each of which are incorporated herein by reference. This invention relates to gas discharge lasers and in particular to wavemeters for high repetition rate gas discharge lasers producing high-energy ultraviolet pulsed laser beams.

BACKGROUND OF THE INVENTION

Electric Discharge Gas Lasers

Electric discharge gas lasers are well known and have been available since soon after lasers were invented in the 1960s. High voltage discharges between two electrodes excite a gaseous gain medium. A resonance cavity containing the gain medium permits stimulated amplification of light, which is then extracted from the cavity in the form of a laser beam. Many of these electric discharge gas lasers are operated in a pulse mode.

Excimer Lasers

Excimer lasers are a particular type of electric gas discharge laser and have been known as such since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in patent '884 is a high repetition rate pulse laser. In FIG. 1 and FIG. 2, the principal elements of the laser 10 are shown. (FIG. 1 corresponds to FIG. 1 and FIG. 2 corresponds to FIG. 7 in patent '884.) The discharges are between two long (about 23 inches) electrodes 18 and 20 spaced apart by about 5/8 inch. Repetition rates of prior art lasers, like the one described are typically within the range of about 100 to 2000 pulses per second. These high repetition rate lasers are usually provided with a gas circulation system. In the above referred to laser, this is done with a long squirrel-cage type fan 46, having about 23 blades 48. The fan blade structure is slightly longer than the electrodes 18 and 20 and provides sufficient circulation so that at operating pulse rates, the discharge disturbed gas between the electrodes is cleared between pulses. A finned water-cooled heat exchanger 58 in FIG. 1 is used to remove heat from the laser gas which is added by the discharges and the fan.

Modular Design

These excimer lasers, when used for integrated circuit lithography, are typically operated on a fabrication line "around-the-clock"; therefore, down time can be expensive. For this reason most of the components are organized into modules which can be replaced normally within a few minutes.

Line Narrowing

Excimer lasers used for lithography must have its output beam reduced in bandwidth to a fraction of a picometer. This "line-narrowing" is typically accomplished in a line narrowing module (called a "line narrowing package" or "LNP") which forms the back of the laser's resonant cavity. This LNP typically is comprised of delicate optical elements including prisms, a mirror and a grating.

Control of Beam Quality

When used as a light source for integrated circuit lithography, the laser beam parameters (i.e., pulse energy, wavelength and bandwidth) typically are controlled to within very tight specifications. This requires pulse-to-pulse feedback control of pulse energy and somewhat slower feedback control of the wavelength of the line narrowed output beam. Wavelength and bandwidth measurements are made using gratings and etalons to produce spectral patterns on photodiode arrays. A doubling or more of the pulse rate requires these feedback control systems to perform much faster.

Increased Repetition Rates

A need exists for gas discharge laser light sources operating at higher average power than prior art devices in order to facilitate increases in production of integrated circuits. One method of increasing average power is to increase the pulse repetition rate to 4000 Hz and greater while maintaining pulse energies in the range of 5–10 mJ. Another method is to increase the pulse energy. Higher repetition rates and/or increased pulse energies create both thermal and radiation challenges inside and downstream of the resonant cavity of these gas discharge lasers especially with respect to delicate optical instruments such as gratings and etalons.

Purge of Beam Path

When high-energy ultraviolet beams, such as 248 nm, 193 nm and 157 nm laser beam pass through air, the photons excite atoms and molecules in the air. These excited molecules and atoms can plate out on sensitive optical components or degrade optical coatings. A known technique to minimize this problem is to enclose and purge the beam path with a purge gas such as nitrogen.

Another prior art reason for purging the beam path especially for the 193 nm and 157 nm lasers, is to eliminate oxygen and other absorbers from the air. Oxygen is a very strong absorber of 157 nm light and a strong absorber of 193 nm light.

What is needed are improvements in the components of these gas discharge lasers to permit high quality performance at these substantially increased average power levels.

SUMMARY OF THE INVENTION

The present invention provides a wavemeter for an ultraviolet laser capable of long life beam quality monitoring in a pulsed ultraviolet laser system at pulse rates greater than 2000 Hz at pulse energies at 5 mJ or greater. In a preferred embodiment an enhanced illumination configuration reduces per pulse illumination of an etalon by a factor of 28 compared to a popular prior art configuration. Optics are provided in this embodiment which reduce light entering the etalon to only that amount needed to illuminate a linear photo diode array positioned to measure interference patterns produced by the etalon. In this preferred embodiment two sample beams produced by reflections from two surfaces of a beam splitter are diffused by a defractive diffuser and the output of the defractive diffuser is focused on two separate secondary diffusers effectively combining both beams in two separate spectrally equivalent diffuse beams. One beam is used for wavelength and bandwidth measurement and the other beam is used for calibration. In preferred embodiments an etalon chamber contains nitrogen with an oxygen concentration of between 1.6 and 2.4 percent.

BRIEF DESCRIPTION OF THE DRAWINGS

FIGS. 5B1–7 show a technique for producing a diffuse beam.

FIG. 5C shows a linear photo diode array.

FIG. 7 shows an enlarged view of portion of FIG. 3.

DETAILED DESCRIPTION OF PREFERRED EMBODIMENTS

Preferred embodiments of the present invention can be described by reference to the drawings.

First Preferred Embodiment

4 KHz ArF Lithography Laser

Figure 3:
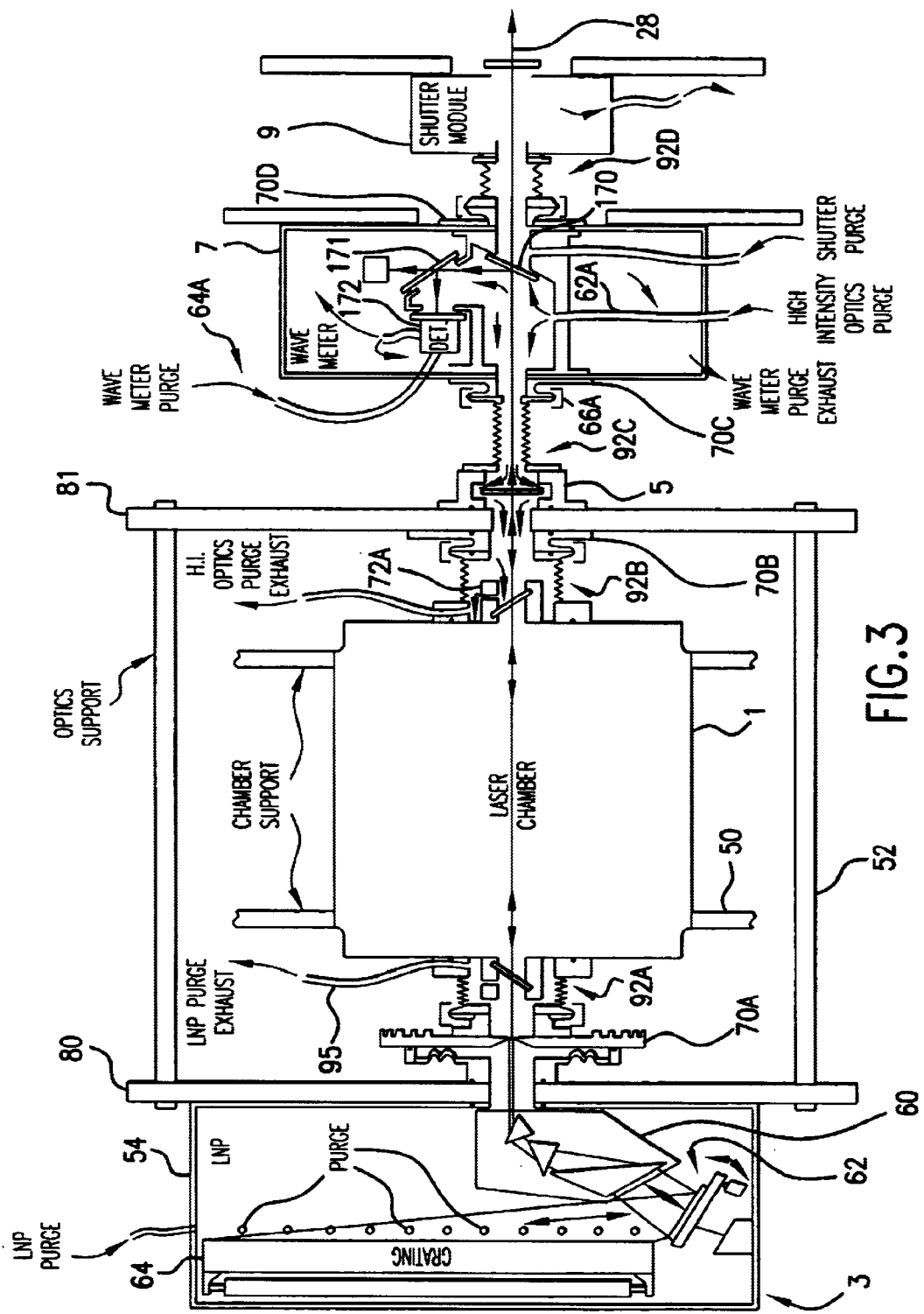
FIG. 3 is a sketch showing features a laser system.

A first preferred embodiment of the present invention is shown in FIG. 3. This is a schematic drawing of the laser chamber and optical components of a high repetition rate ArF excimer laser useful for integrated circuit lithography. This laser system is designed to operate at a repetition rate 4000 pulses per second producing narrow band pulses of 5 mJ. (The basic components of this system are the same for a companion KrF excimer laser designed to operate at 4,000 Hz with pulse energies of 10 mJ. The laser pulses of the ArF laser are at a wavelength of about 193 nm and the wavelength of the KrF laser pulses are about 248 nm). Principle modules of the laser system shown in FIG. 3 are the line narrowing package LNP module 3, the laser chamber module 1, the output coupler module 5, the wavemeter module 7 and the shutter module 9.

The LNP module 3 is mounted along with output coupler 5 on a low thermal expansion material (such as Invar®) three bar mount 52 (only two of the bars are shown in the figure) which is supported independent of the chamber module and isolates the LNP and the output coupler from chamber caused vibrations resulting primarily from laser discharges and fan rotation. The LNP includes a metal case 54 which contains a three prism beam expander 60, a tuning mirror 62 and a grating unit 64.

Figure 4:
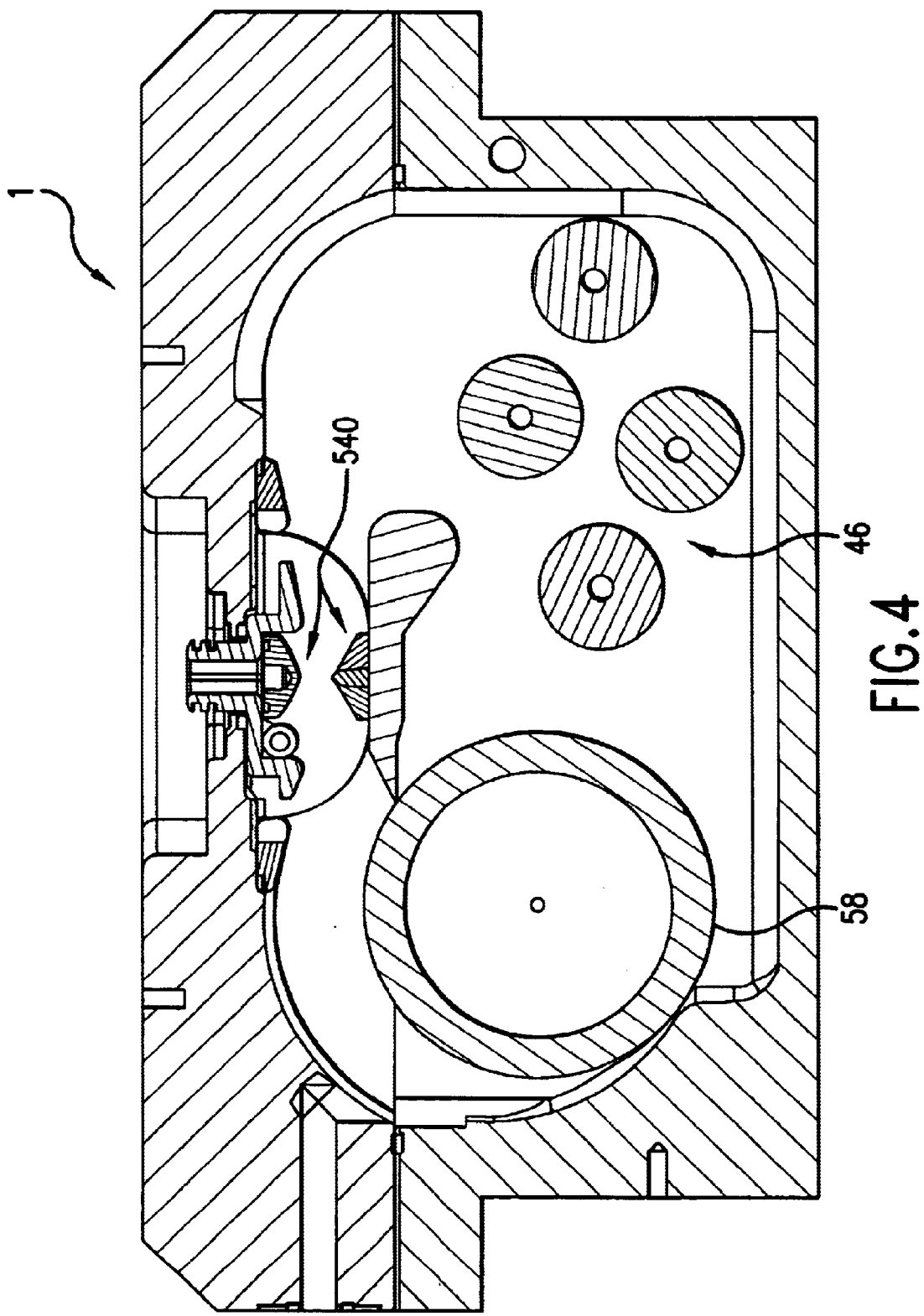
FIG. 4 shows a cross section of a laser chamber of the preferred embodiment.

Shown in FIG. 3 is laser chamber module 1 which is shown in cross section in FIG. 4. This chamber designed for 4,000 Hz operation as described above comprises four water cooled finned heat exchanger elements 46 and a five inch diameter tangential fan 58 and two 50 cm long electrodes 540 all of which are similar in design to prior art chamber components but in this case are designed for the higher 4,000 Hz repetition rate. A pulse power system (not shown) provides high voltage electrical pulses to produce discharges between electrodes 540 in the laser gas (in this ArF laser: 3.5 percent argon, 0.1 percent fluorine and the rest neon). The laser chamber is supported on rails 50 which are mounted within a laser frame (not shown) independent of the optical components of the laser system.

The output coupler module 5 is comprised of a metal container enclosing a partially reflecting mirror comprised of $CaF_2$ and which is coated to reflect 20 percent of light at the nominal ArF laser wavelength of 193 nm (preferred reflection for KrF is 20%). This module is mounted on support 81 of 3-bar mount 52 and it along with the grating in the LNP defines the boundary of the resonant cavity for this laser system.

Immediately downstream of output coupler module 5 is wavemeter module 7 as shown in FIG. 3. In this drawing, some of the components are shown with orientations different from actual in order to show in two-dimension an important purging technique of the high energy intensity portion of the wavemeter. In the actual preferred embodiment, most of the wavemeter components are arranged in a pattern geometrically perpendicular to the beam path. The main laser output beam passes straight through the wavemeter and a small portion of the beam is picked off by partially reflecting mirror 170 for analysis in the wavemeter. This analyzed portion of the beam within the wavemeter generally defines a plane perpendicular to the axis of the main laser beam 28.

Improved Wavemeter

Figure 5:
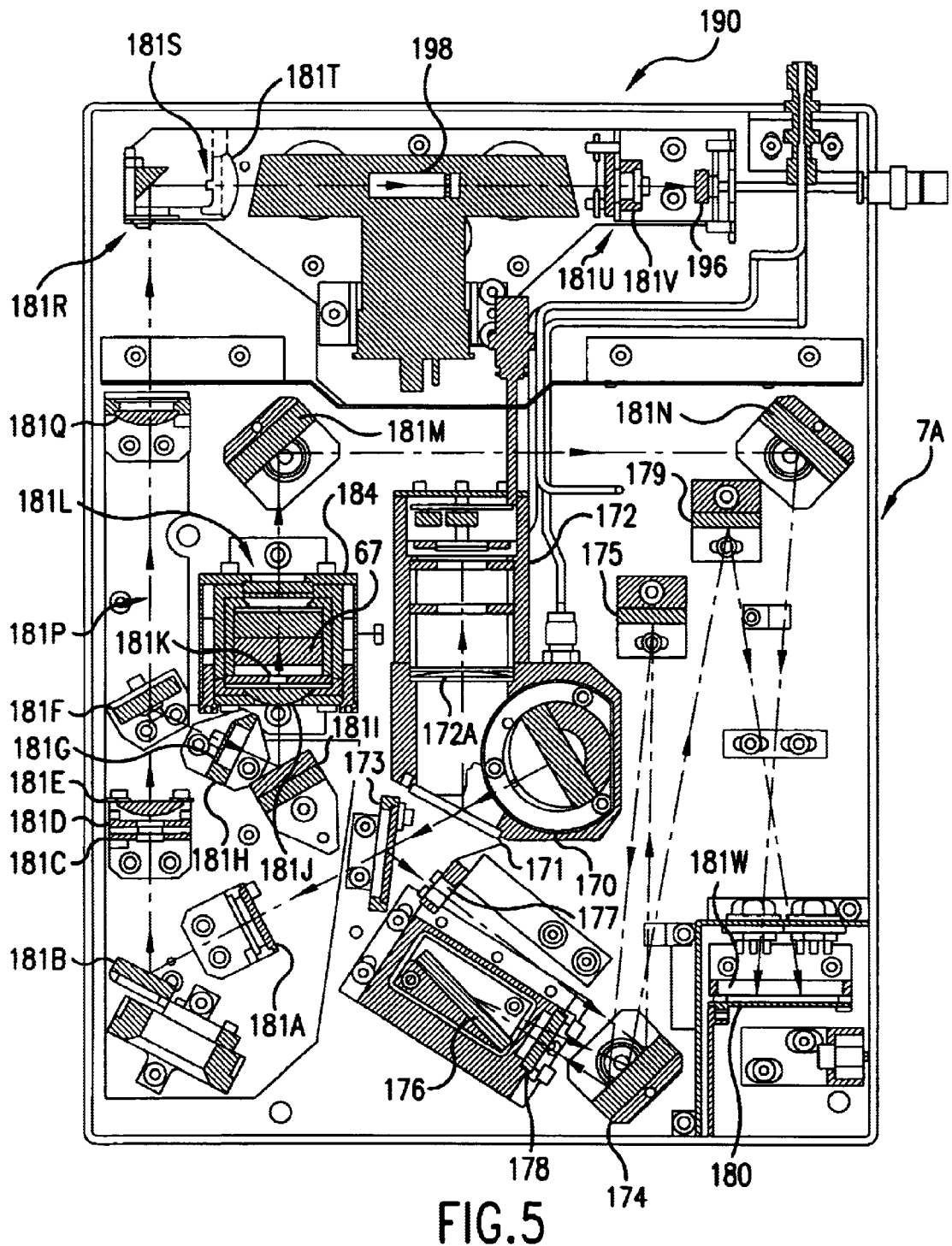
FIG. 5 shows components of a wavemeter of the preferred embodiment.

FIG. 5 shows the components of an improved wavemeter 7A in their actual orientation. The wavemeter includes grating 176 for a course measurement of wavelength and elaton 184 for a fine measurement of wavelength and bandwidth. Spectral lines from both of these instruments are monitored on a single photodiode array 180. The wavemeter includes calibration unit 190 (called an AWR for atomic wavelength reference) which includes vapor absorption cell 198 and photodiode 196 which permits a calibration of the wavemeter by comparing the optical signals from array 180 to the known absorption spectrum of the metal vapor in cell 198. For the ArF laser this metal vapor is platinum vapor. Arrows in FIG. 5 show the beam paths through the wavemeter.

Enhanced Illumination

Figure 11:
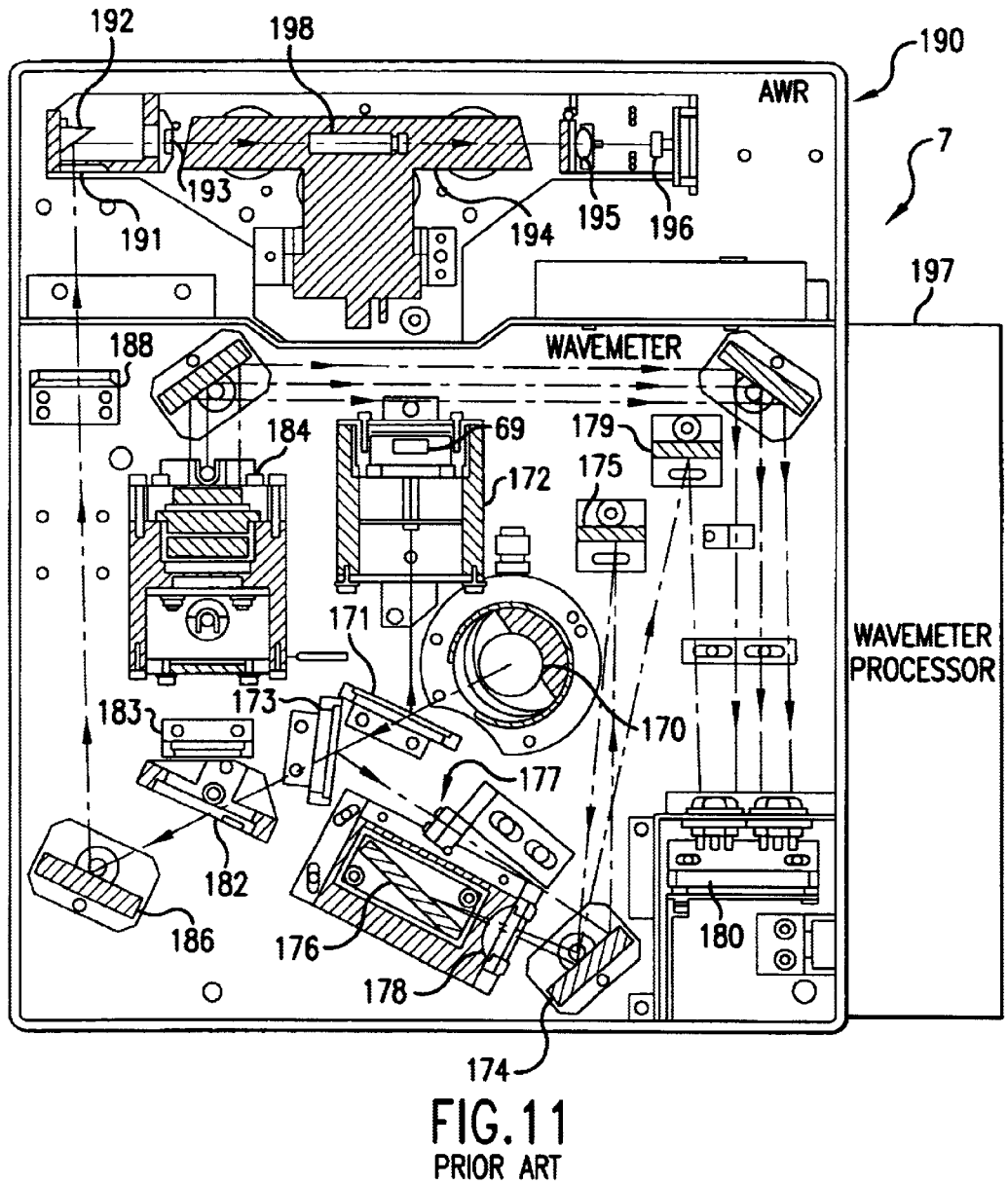
FIG. 11 shows features of a state-of-the-art wavemeter.

The present invention through newly configured optical components permits a factor of 28 reduction in the illumination of etalon unit 184 as compared with prior state-of-the-art wavemeters currently in use for monitoring wavelength of lithography laser light sources. A drawing of this state-of-the-art wavemeter is shown in FIG. 11 and is described in detail in U.S. patent application Ser. No. 10/027,210 which is incorporated by reference herein. Improvements provided by the present invention not only greatly lengthens the etalon lifetime so that it is no longer a lifetime limiting component of the wavemeter but the improvement also substantially improves the stability and other performance features of the wavemeter. The improved configuration is shown in FIG. 5. Most of the components of the wavemeter shown in FIG. 5 are the same as the wavemeter shown in FIG. 11 and the reference numbers are the same.

Reflection From Beam Splitter

Figure 7:
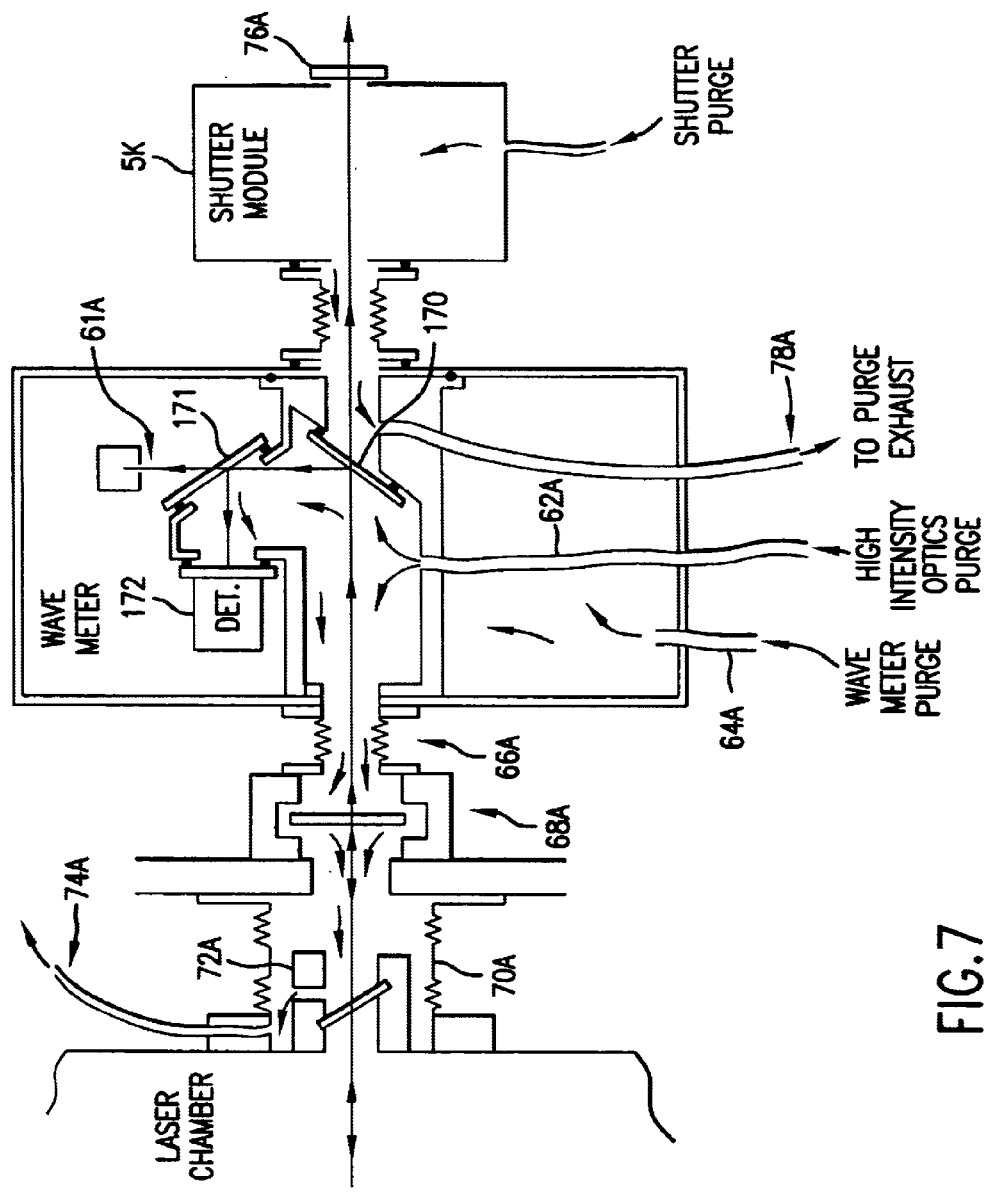

A portion of the laser output beam is picked off the output beam by beam splitter 170 as shown in FIG. 3 and FIG. 7 as the output beam passes through the wavemeter. This portion is about 4.5 percent of the output beam. Approximately half of this 4.5 percent is reflected from the upstream surface of the beam splitter and about half is reflected from the downstream surface. Thus, the beam reflected into wavemeter by beam splitter 170 is actually two separate beams offset from each other spatially by about 3 mm. The beam from the downstream reflection is also offset in time from the upstream beam and this time difference represents about 1000 periods or wavelengths of the 193 nm light.

Pulse Energy

About 4% of the reflected beam is reflected by mirror 171 diffused by diffuser 172A and monitored by energy detector 172 which comprises a very fast photo diode 69 which is able to measure the energy of individual pulses occurring at the rate of 4,000 pulses per second. The pulse energy for a typical ArF excimer laser is about 5 mJ, and the output of detector 69 is fed to a computer controller which uses a special algorithm to adjust the laser charging voltage to precisely control the pulse energy of future pulses based on stored pulse energy data in order to control the variation of the energy of individual pulses and the integrated energy of bursts of pulses. In the past Applicants have noticed that the signal from this fast photodiode 69 tends to drift when calibrated against a precision energy detector. Applicants have discovered many causes of this drift. These causes have been eliminated when feasible. The causes of drift have included variations in reflections from the 170 beam splitter, variation in reflection from the 171 beam splitter, variation in the diffusing properties of diffuser 172A, changes in the circuit elements of photodiode 69 and interactions of the beam photons with the walls of energy detection 172.

Applicants have lined the inside walls of the detector with glass. Various diffusers have been tested and UV/ozone cleaning procedures have been implemented to clean the diffusers. Etched diffusers have been ordered to replace ground glass diffusers. All of these techniques resulted in reduced drift of the energy detector 172. However, drift has not been eliminated. The most successful technique for reducing drift has been to subject the power cells to prolonged laser UV radiation and let it drift until the drifting levels out. Applicants call this process seasoning of the power cell. The power cell may be seasoned with 248 nm light or 193 but Applicants' have determined that 193 nm is more effective of the two wavelengths.

Linear Photo Diode Array

Figure 6A:
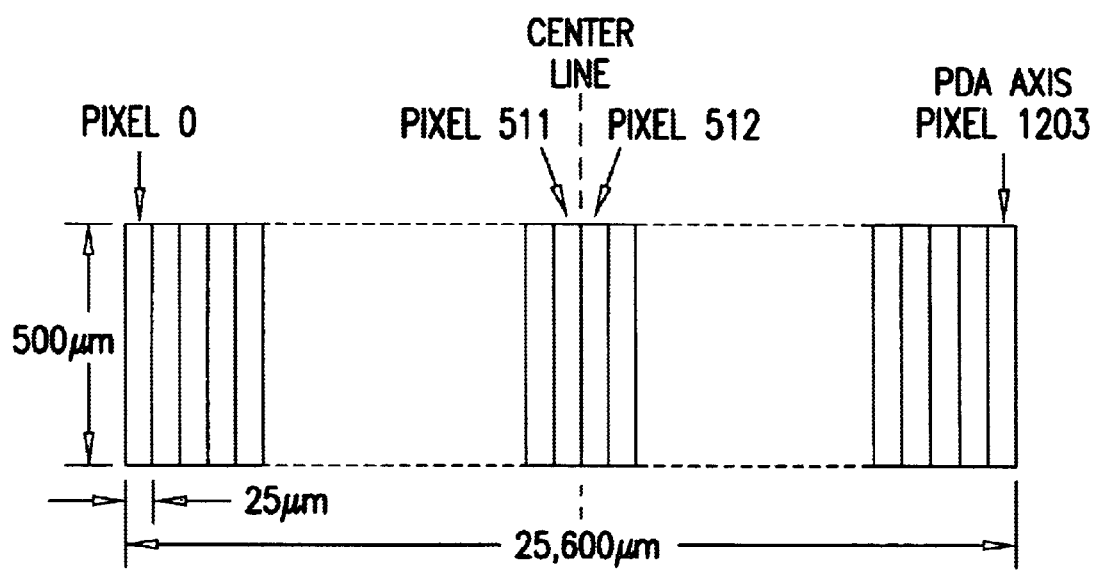
FIGS. 6A–D show techniques for making spectral measurements.

Photo diode array 180 is in this embodiment an integrated circuit chip comprising 1024 separate photo diode integrated circuits and an associated sample and hold readout circuit. As shown in FIG. 6A, the photo diodes are on a 25 micrometer pitch for a total length of 25.6 mm (about one inch). Each photo diode is 500 micrometers long.

Photo diode arrays such as this are available from several sources. A preferred supplier is Hamamatsu. In our preferred embodiment, we use a Model S3903-1024Q which can be read at the rate of up to $4 \times 10^6$ pixels/sec on a FIFO basis in which complete 1024 pixel scans can be read at rates of 4,000 Hz or greater. The PDA is designed for $2 \times 10^6$ pixel/sec operation but Applicants have found that it can be over-clocked to run much faster, i.e., up to $4 \times 10^6$ pixel/sec. For pulse rates greater than 4,000 Hz, Applicants can use the same PDA but only a fraction (such as 60%) of the pixels are normally read on each scan.

Coarse Wavelength Measurement

Figure 6B:
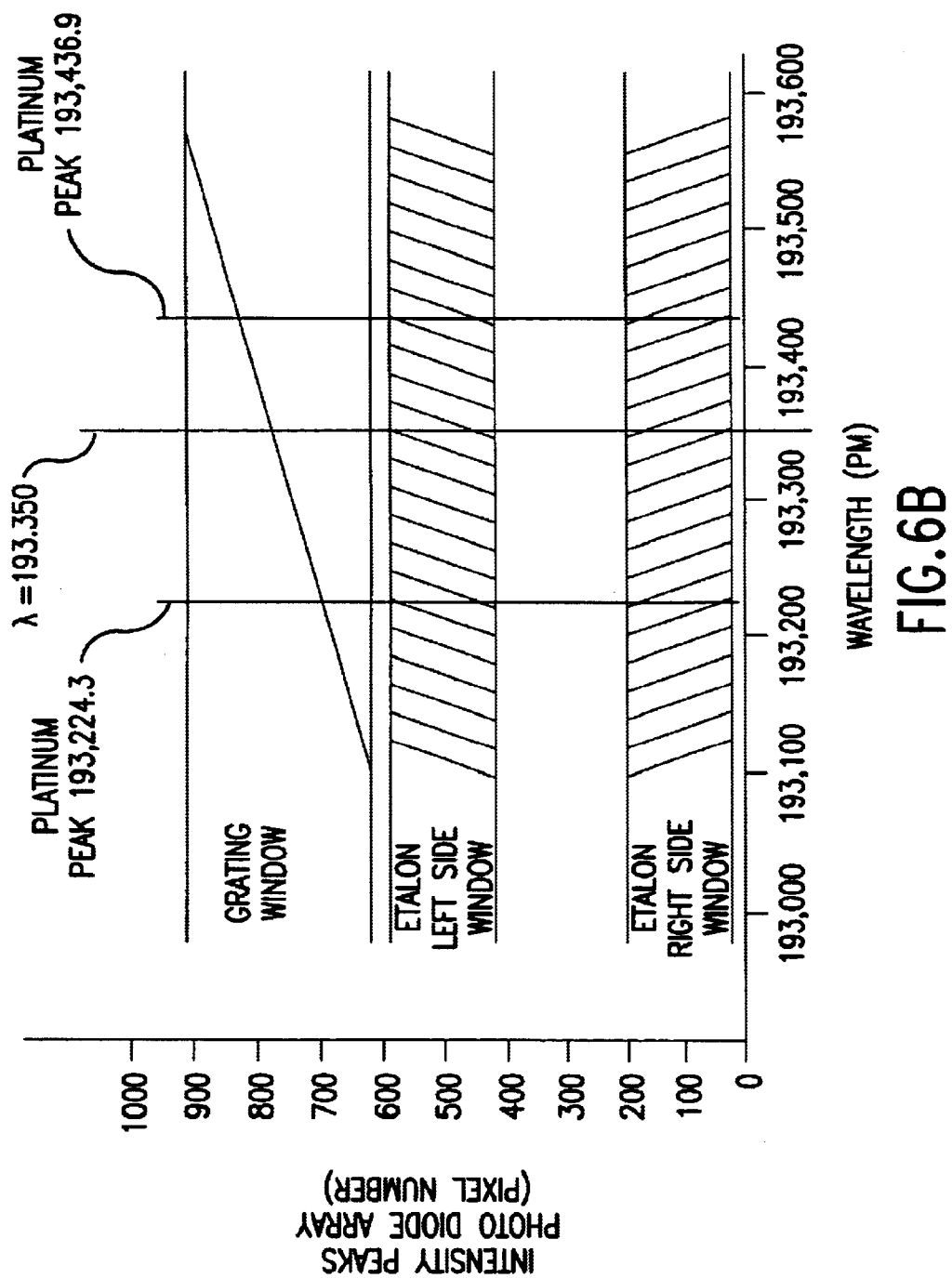

About 4% of the beam which passes through mirror 171 is reflected by beam splitter 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174 and then is reflected from mirror 179 and focused onto the left side of 1024-pixel linear photo diode array 180 (as viewed by the beam) in the region of pixel 600 to pixel 950 as shown in the upper part of FIG. 6B (Pixels 0–618 are reserved for fine wavelength measurement and bandwidth.) The spatial position of the beam on the photo diode array is a coarse measure of the relative nominal wavelength of the output beam. For example, as shown in FIG. 6B, light in the wavelength range of about 193.350 pm would be focused on pixel 750 and its neighbors.

Calculation of Coarse Wavelength

Figure 6C:
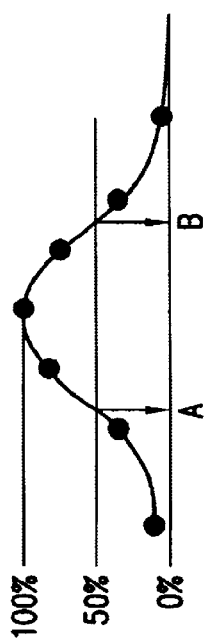

The coarse wavelength optics in wavemeter module 120 produce a rectangular image of about 0.25 mm×3 mm on the left side of photo diode array 180. The ten or eleven illuminated photo diodes will generate signals in proportion to the intensity of the illumination received (as indicated in FIG. 6C) and the signals are read and digitized by a processor in wavemeter a controller (not shown). Using this information and an interpolation algorithm, the controller calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 pm/\text{pixel})P + 191{,}625 pm$$

where P=coarse image central positions.

Alternatively, additional precision could be added if desired by adding a second order term such as "+( )$P^2$.

Beam Path for Fine Wavelength Measurement

About 95% of the beam passes through mirror 173 as shown in FIG. 5, passes through lens 181A, reflects off mirror 181B, passes through lens 181C, defractive diffuser 181D and lens 181E to beam splitter 181F. At beam splitter 181F the beam is split so that 90 percent of the beam is directed to etalon 184 and 10 percent of the beam is directed to atomic wavelength reference unit 190. Lens 181E focuses the diffusing beam from defractive diffuser 181D at two locations: at the front face of ground glass diffuser 181G on the path to etalon 184 and at an equidistance location 181P on the path to AWR unit 190.

The portion of the beam directed by beam splitter 181F to etalon 184 is diffused as it passes through ground glass diffuser 181G, and a portion of the twice diffused beam passes through slit 181H and is reflected by mirror 181I through collimating lens 181J and larger aperture 181K then through closely spaced etalon plates 67, and the beam then is focused by lens 181L after reflecting from mirrors 181M and 181N into a 1½ mm by 20 mm spot 181W overlapping a 15 mm long portion of photo diode array 180 comprising 618 pixels as shown in FIG. 5C.

The portion of the split beam directed by beam splitter 181F to AWR unit 190 passes through a focus at 181P as described above, and that focus is imaged by lens 181Q onto ground glass diffuser 181R which is equivalent to ground glass diffuser 181G. A portion of this twice diffused beam is selected by aperture 181S and the portion selected is collimated by lens 181T so that the beam passes through a platinum vapor environment in metal vapor cell 198. The platinum vapor absorbs light at a well known large absorption lines at 193,224.3 nm and 193,436.9 (these lines are indicated in FIG. 6B and are used to calibrate the wavemeter). Light passing through the vapor cell is apertured at aperture 181U and the apertured beam is focused by lens 181V onto photo diode 196 which measures the energy in the beam. (At this point the reader should be aware that the signal from photo diode 196 will be at a minimum when the wavelength of the output of the laser is centered at one of the above platinum absorption lines.)

Reducing Telescope

As described above, beam splitter 173 produces two separate parallel rectangular beams by reason of separate reflections from both sides of the beam splitter. In the beam train described above, lens 181A and lens 181C together constitute a reducing telescope which reduces the cross-section size of the two rectangular beams (having dimensions of about 2 mm×18 mm which are spaced apart by about 3 mm (measured from the center of the rectangles) by a factor of about 10 to two rectangles (0.2 mm×1.8 mm) spaced apart by about 0.3 mm. These two rectangular "spots" are diffused by defractive diffuser 181D so that at the exit plane of the defractive diffuser, the rays of the two beams are thoroughly mixed, (with photons spreading approximately randomly) diffusing at angles from zero with the beam axis to about 10 degrees.

Producing Overlapping Diffuse Beams

Figure 1:
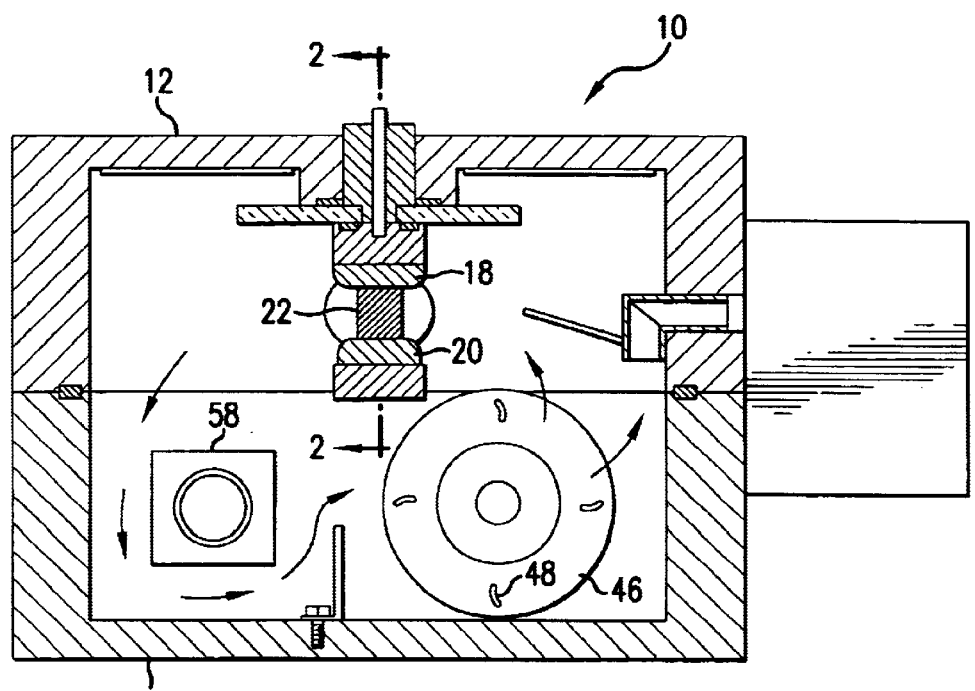
FIGS. 1 and 2 show features of a prior art laser system.
Figure 2:
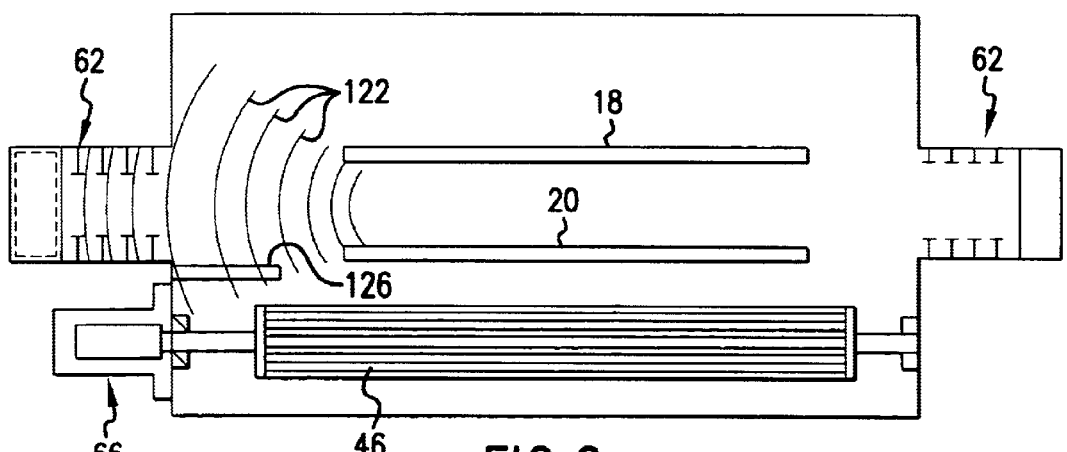

Lens 181E images the exit plane of diffuser 181D through ground glass diffuser 181G. A small portion of the diffusing beam is selected by slit 181H immediately downstream of ground glass diffuser 181G and that selected portion is directed by mirror 181I into etalon unit 184. FIGS. 5 B1–7 shows qualitatively the evolution of the two beams between beam splitter 173 and etalon 184. FIG. 5B1 shows a cross section at the beam split off by mirror 170. FIG. 5B2 shows the cross section upstream of the entrance surface of defractive diffuser 181D as reduced by reducing telescope 181A and 181C. FIG. 5B 3 shows that the two diffuse beams indistinguishable at the exit place of diffuser 181D. FIG. 5B4 depicts lens 181E focusing the merged beams to produce an overlapping image of the two merged and diffuse beams as shown in FIG. 5B5 and FIG. 5B6 shows them overlapping slit 181H. FIG. 5B7 shows a side view of ground glass diffuser 181G and slit 181H with only a tiny fraction of the light in the two beams actually passing through slit 181H.

Positioning the Interference Pattern

Proper functioning of etalon 184 depends on the incoming beam being very randomly diffuse. However, only beams oriented within about 6 degrees of the beam axis can traverse the etalon unit. Therefore, a good etalon design would provide a diffuse beam with all portions of the beam having relatively uniform random directions but all within about 6 degrees. The illumination configuration described above substantially meets the criteria. In addition since ultraviolet radiation produces long term degradation of the sensitive optics reducing the ultraviolet intensity to a minimum level necessary to good results is also highly desirable. This configuration also meets this criteria.

Lens 181L is a 458.4 mm focal length lens. It focuses the output plane of etalon 184 onto the portion of photo diode array 180 reserved for fine wavelength and bandwidth measurement. The light produces interference patterns which are detected by 619 pixels and the signals from these pixels are analyzed by a fast processor to calculate wavelength and bandwidth for each pulse which in this preferred embodiment are coming in at the rate of 4000 pulses per second.

As explained above, this preferred embodiment is carefully designed to minimize the light passing through etalon unit 184 to only that which is needed for the wavelength and bandwidth measurements. The quantity of light passing through the etalon has been estimated by Applicants to be reduced by a factor of 28 as compared to the current state-of-art wavemeter shown in FIG. 4C. This has resulted in longer estimated etalon life and substantially better performance despite the increase in repetition rate from about 2000 Hz to about 4000 Hz.

Alignment

In this configuration proper alignment is important since as describes above both of the beams picked off by beam splitter 170 must be imaged on slit 181H to assure that a good representation of the output beam is being monitored by etalon 184 and PDA array 180. To provide for fine alignment tilt and tip alignment bolts are provided for mirror 181B which can be operated from outside wavemeter 7. In addition micron alignment in X and Y direction are provided for slit 181H. Laser operator adjusts the position of mirror 181B and aperture 181H until the image of the interfered beam at PDA array 180 overlaps pixels, 1 to 618 on the left side of the 1024-pixel PDA approximately as shown at 181W in FIG. 5C.

Illumination of AWR

This preferred embodiment is configured to assure that the reference unit 190 is monitoring the same spectral information as etalon 184 during calibrations of the etalon. This is accomplished with the configuration shown in FIG. 5 with lens 181E focusing the diffuse images of the two beams from beam splitter 170 at two foci both of which are diffused again with equivalent diffusers and collimated similarly for simultaneous analysis as the laser wavelength is scanned over one or more the platinum absorption line of the platinum vapor in cell 198 during calibration procedure.

Calculation of Bandwidth and Wavelength

The spectrometer must measure wavelength and bandwidth substantially in real time. Because the laser repetition rate may be 4,000 Hz to 6,000 Hz, it is necessary to use algorithms which are accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Figure 6D:
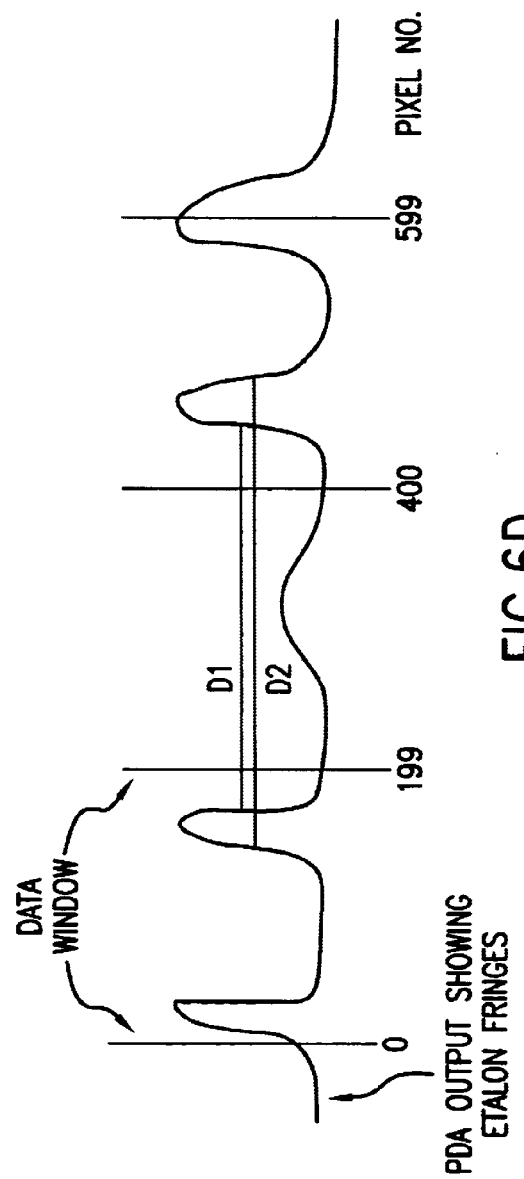

The specific details of a preferred algorithm used in this preferred embodiment will now be described. FIG. 6D is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks can be used to determine the wavelength, while their width measures the bandwidth of the laser. Two regions, each labeled data window, are shown in FIG. 6D. The data windows are located so that the fringe nearest the central peak is normally used for the analysis.

However, when the wavelength changes to move the fringe too close to the central peak (which will cause distortion and resulting errors), the first peak is outside the window, but the second closest peak will be inside the window, and the software causes the processor in control module 197 to use the second peak. Conversely, when the wavelength shifts to move the current peak outside the data window away from the central peak the software will jump to an inner fringe within the data window. The data windows are also depicted on FIG. 6B.

Figure 12:
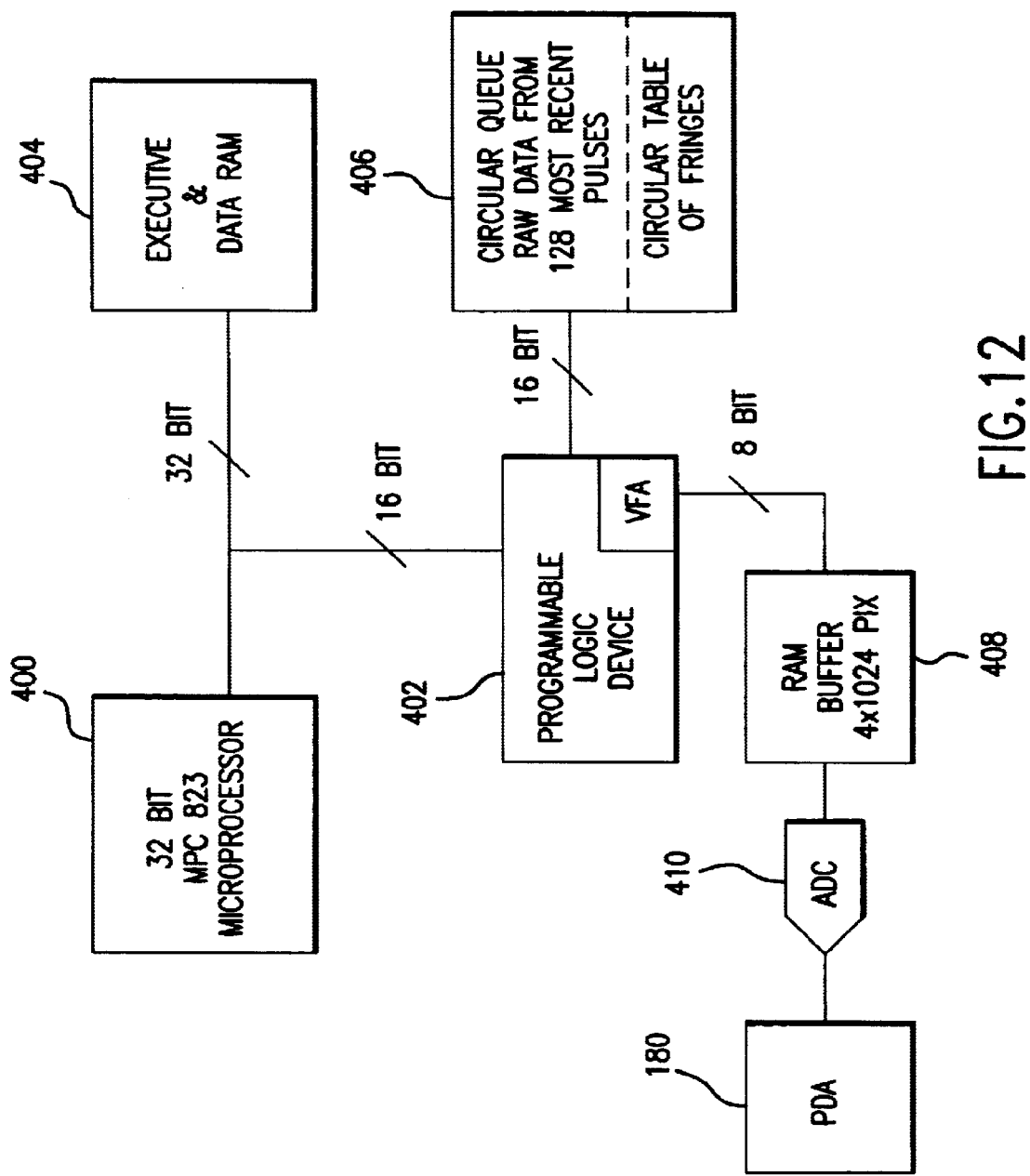
FIG. 12 shows a control configuration.

For very fast computation of bandwidth for each pulse at repetition rates up to the range of 4,000 Hz to 6,000 Hz a preferred embodiment uses the hardware identified in FIG. 12. The hardware includes a microprocessor 400, Model MPC 823 supplied by Motorola with offices in Phoenix, Ariz.; a programmable logic device 402, Model EP 6016QC240 supplied by Altera with offices in San Jose, Calif.; an executive and data memory bank 404; a special very fast RAM 406 for temporary storage of photodiode array data in table form; a third 4×1024 pixel RAM memory bank 408 operating as a memory buffer; and an analog to digital converter 410.

As explained in U.S. Pat. Nos. 5,025,446 and 5,978,394, prior art devices were required to analyze a large mass of PDA data pixel intensity data representing interference fringes produced by etalon 184 an photodiode array 180 in order to determine center line wavelength and bandwidth. This was a relatively time consuming process even with a computer processor because about 400 pixel intensity values had to be analyzed to look for and describe the etalon fringes for each calculation of wavelength and bandwidth. A preferred embodiment of the present invention greatly speeds up this process by providing a processor for finding the important fringes which operates in parallel with the processor calculating the wavelength information.

The basic technique is to use programmable logic device 402 to continuously produce a fringe data table from the PDA pixel data as the pixel data are produced.

Logic device 402 also identifies which of the sets of fringe data represent fringe data of interest. Then when a calculation of center wavelength and bandwidth are needed, microprocessor merely picks up the data from the identified pixels of interest and calculates the needed values of center wavelength and bandwidth. This process reduces the calculation time for microprocessor by about a factor of about 10.

Specific steps in the process of calculating center wavelength and bandwidth are as follows:

1) With PDA 180 clocked to operate at 2.5 MHz, PDA 180 is directed by processor 400 to collect data at a from pixels 1 to 600 at a scan rate of 4,000 Hz and to read pixels 1 to 1028 at a rate of 100 Hz.
2) The analog pixel intensity data produced by PDA 180 is converted from analog intensity values into digital 8 bit values (0 to 255) by analog to digital converter 410 and the digital data are stored temporarily in RAM buffer 408 as 8 bit values representing intensity at each pixel of photodiode array 180.
3) Programmable logic device 402 analyzes the data passing out of RAM buffer 408 continuously on an almost real time basis looking for fringes, stores all the data in RAM memory 406, identifies all fringes for each pulse, produces a table of fringes for each pulse and stores the tables in RAM 406, and identifies for further analysis one best set of two fringes for each pulse. The technique used by logic device 402 is as follows:

A) PLD 402 analyzes each pixel value coming through buffer 408 to determine if it exceeds an intensity threshold while keeping track of the minimum pixel intensity value. If the threshold is exceeded this is an indication that a fringe peak is coming. The PLD identifies the first pixel above threshold as the "rising edge" pixel number and saves the minimum pixel value of the pixels preceding the "rising edge" pixel. The intensity value of this pixel is identified as the "minimum" of the fringe.

B) PLD 402 then monitors subsequent pixel intensity values to search for the peak of the fringe. It does this by keeping track of the highest intensity value until the intensity drops below the threshold intensity.

C) When a pixel having a value below threshold is found, the PLD identifies it as the falling edge pixel number and saves the maximum value. The PLD then calculates the "width" of the fringe by subtracting the rising edge pixel number from the falling edge pixel number.

D) The four values of rising edge pixel number, maximum fringe intensity, minimum fringe intensity and width of the fringe are stored in the circular table of fringes section of RAM memory bank 406. Data representing up to 15 fringes can be stored for each pulse although most pulses only produce 2 to 5 fringes in the two windows.

E) PLD 402 also is programmed to identify with respect to each pulse the "best" two fringes for each pulse. It does this by identifying the last fringe completely within the 0 to 199 window and the first fringe completely within the 400 to 599 window.

The total time required after a pulse for (1) the collection of the pixel data, and (2) the formation of the circular table of fringes for the pulse is only about 200 micro seconds. The principal time saving advantages of this technique is that the search for fringes is occurring as the fringe data is being read out, digitized and stored. Once the two best fringes are identified for a particular pulse, microprocessor 400 secures the raw pixel data in the region of the two fringes from RAM memory bank 406 and calculates from that data the bandwidth and center wavelength. The calculation is as follows:

Typical shape of the etalon fringes are shown in FIG. 6D. Based on the prior work of PLD 402 the fringe having a maximum at about pixel 180 and the fringe having a maximum at about pixel 450 will be identified to microprocessor 400. The pixel data surrounding these two maxima are analyzed by microprocessor 400 to define the shape and location of the fringe. This is done as follows:

A half maximum value is determined by subtracting the fringe minimum from the fringe maximum dividing the difference by 2 and adding the result to the fringe minimum. For each rising edge and each falling edge of the two fringes the two pixels having values of closest above and closest below the half maximum value. Microprocessor then extrapolates between the two pixel values in each case to define the end points of D1 and D2 as shown in FIG. 6D with a precision of 1/32 pixel. From these values the inner diameter D1 and the outer diameter D2 of the circular fringe are determined.

Fine Wavelength Calculation

The fine wavelength calculation is made using the course wavelength measured value and the measured values of D1 and D2.

The basic equation for wavelength is:

$$\lambda = (2*n*d/m)\cos(R/f) \quad (1)$$

where

λ is the wavelength, in picometers, n is the internal index of refraction of the etalon, about 1.0003, d is the etalon spacing, about 1542 um for KrF lasers and about 934 μm for ArF lasers, controlled to +/−1 um, m is the order, the integral number of wavelengths at the fringe peak, about 12440, R is the fringe radius, 130 to 280 PDA pixels, a pixel being 25 microns, f is the focal distance from the lens to the PDA plane.

Expanding the cos term and discarding high order terms that are negligibly small yields:

$$\lambda = (2*n*d/m)[1-(\tfrac{1}{2})(R/f)^2] \quad (2)$$

Restating the equation in terms of diameter D=2*R yields:

$$\lambda = (2*n*d/m)[1-(\tfrac{1}{8})(D/f)^2] \quad (3)$$

The wavemeter's principal task is to calculate λ from D. This requires knowing f, n, d and m. Since n and d are both intrinsic to the etalon we combine them into a single calibration constant named ND. We consider f to be another calibration constant named FD with units of pixels to match the units of D for a pure ratio. The integer order m varies depending on the wavelength and which fringe pair we choose. m is determined using the coarse fringe wavelength, which is sufficiently accurate for the purpose.

A couple of nice things about these equations is that all the big numbers are positive values. The WCM's microcontroller is capable of calculating this while maintaining nearly 32 bits of precision. We refer to the bracketed terms as FRAC.

$$FRAC = [1-(\tfrac{1}{8})(D/FD)^2] \quad (4)$$

Internally FRAC is represented as an unsigned 32 bit value with its radix point to the left of the most significant bit. FRAC is always just slightly less than one, so we get maximal precision there. FRAC ranges from [1−120E-6] to [1−25E-6] for D range of {560~260} pixels.

When the ND calibration is entered, the wavemeter calculates an internal unsigned 64 bit value named 2ND=2*ND with internal wavelength units of femtometers (fm)=10⁻¹⁵ meter=0.001 pm. Internally we represent the wavelength λ as FWL for the fine wavelength, also in fm units. Restating the equation in terms of these variables:

$$FWL = FRAC*2ND/m \quad (5)$$

The arithmetic handles the radix point shift in FRAC yielding FWL in fm. We solve for m by shuffling the equation and plugging in the known coarse wavelength named CWL, also in fm units:

$$m = \text{nearest integer}(FRAC*2ND/CWL) \quad (6)$$

Taking the nearest integer is equivalent to adding or subtracting FSRs in the old scheme until the nearest fine wavelength to the coarse wavelength was reached. Calculate wavelength by solving equation (4) then equation (6) then equation (5). We calculate WL separately for the inner and outer diameters. The average is the line center wavelength, the difference is the linewidth.

Bandwidth Calculation

The bandwidth of the laser is computed as $(\lambda_2-\lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction Δλε is subtracted, which provides sufficient accuracy. Therefore, the bandwidth is:

$$\Delta\lambda = \left(\frac{D_2 - D_1}{2}\right) - \Delta\lambda\epsilon$$

Δλε depends on both the etalon specifications and the true laser bandwidth. It typically lies in the range of 0.1–1 pm for the application described here.

Feedback Control of Pulse Energy and Wavelength

Based on the measurement of pulse energy of each pulse as described above, the pulse energy of subsequent pulses are controlled to maintain desired pulse energies and also desired total integrated dose of a specified number of pulses all as described in U.S. Pat. No. 6,005,879, Pulse Energy Control for Excimer Laser which is incorporated by reference herein.

Wavelength of the laser may be controlled in a feedback arrangement using measured values of wavelengths and techniques known in the prior art such as those techniques described in U.S. Pat. No. 5,978,394, Wavelength System for an Excimer Laser also incorporated herein by reference. Applicants have recently developed techniques for wavelength tuning which utilize a piezoelectric driver to provide extremely fast movement of tuning mirror. Some of these techniques are described in U.S. patent application Ser. No. 09/608,543, Bandwidth Control Technique for a Laser, filed Jun. 30, 2000 which is incorporated herein by reference. A piezoelectric stack 80 is used for very fast mirror adjustment and larger slower adjustments are provided by a prior art stepper motor 82 operating a lever arm 84. The piezoelectric stack adjusts the position of the fulcrum of the lever arm.

Etalon Assembly Process

Figure 8:
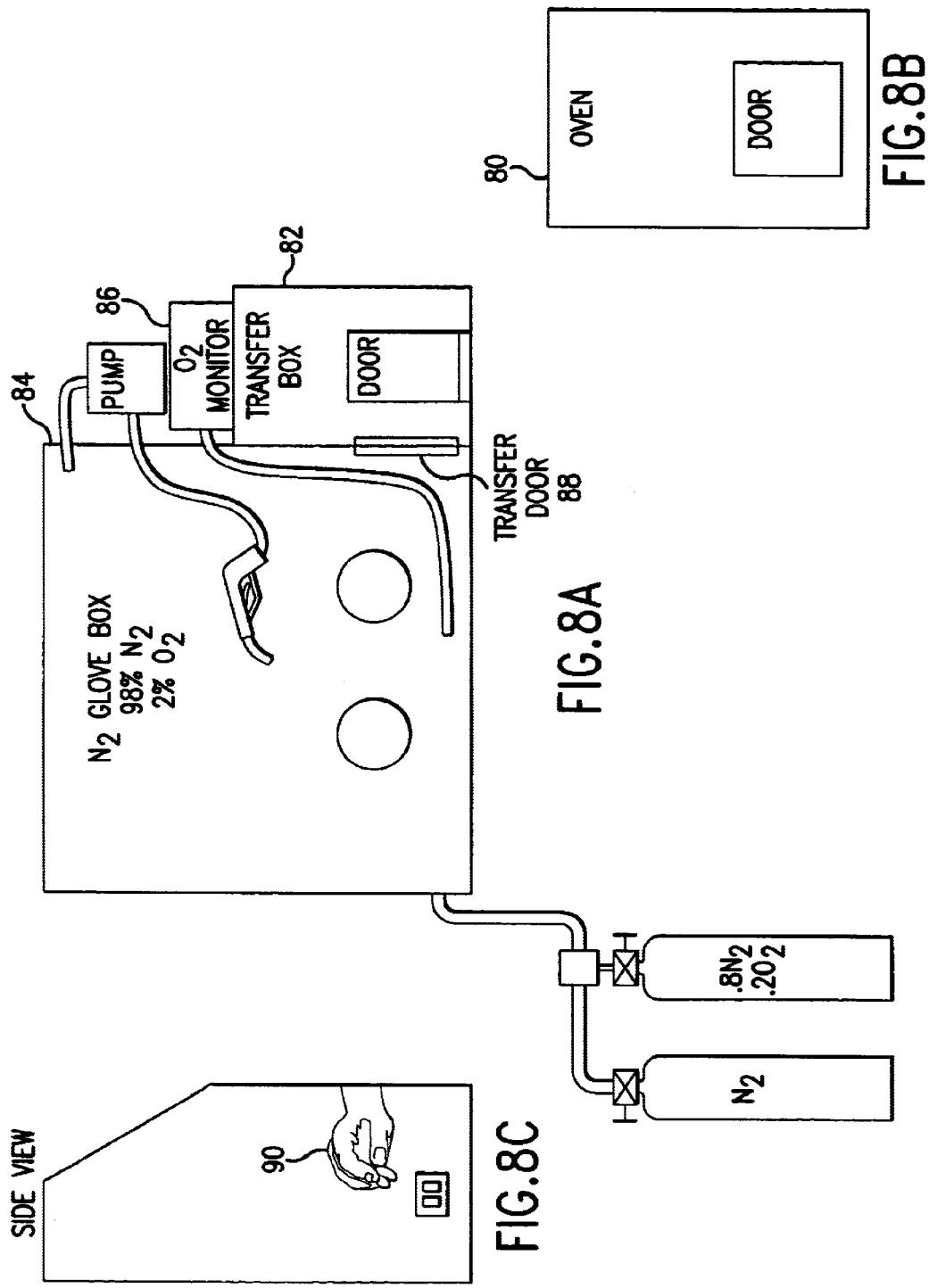
FIGS. 8A, B and C show a set-up for assembly etalon units.
Figure 9:
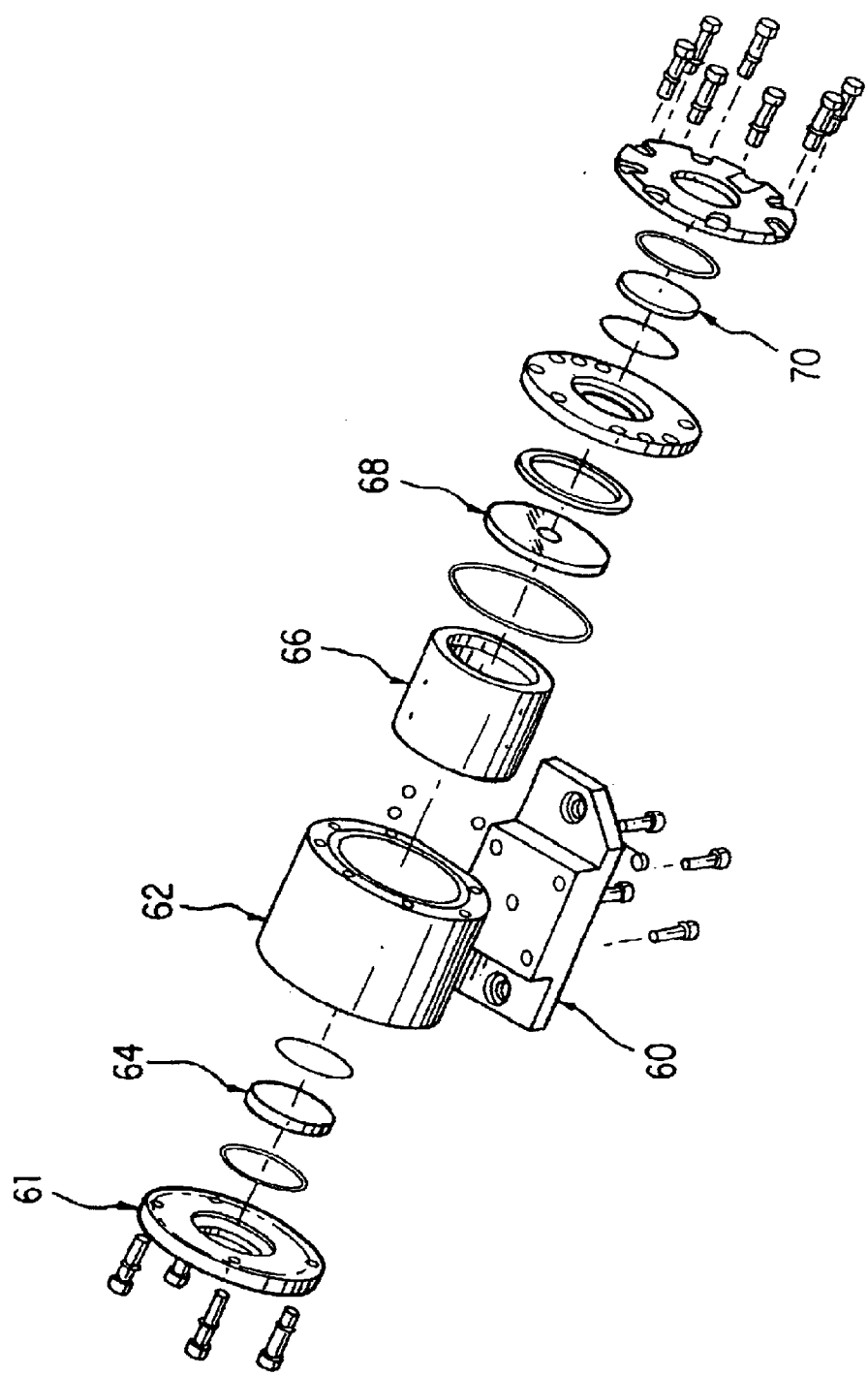
FIG. 9 shows the parts of an etalon unit.
Figure 10A:
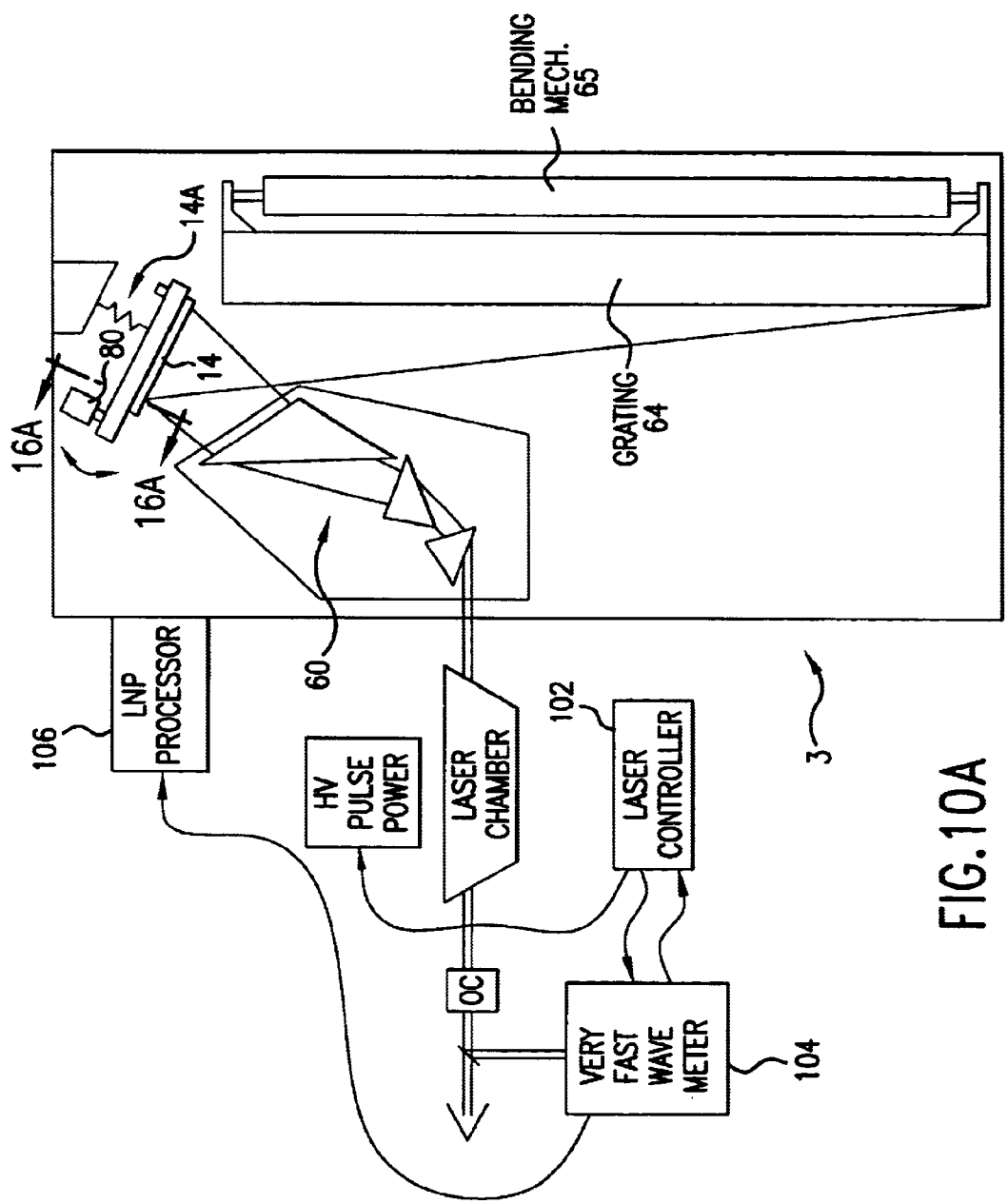
FIGS. 10A and 10B show features of a line-narrowing package.
Figure 10B:
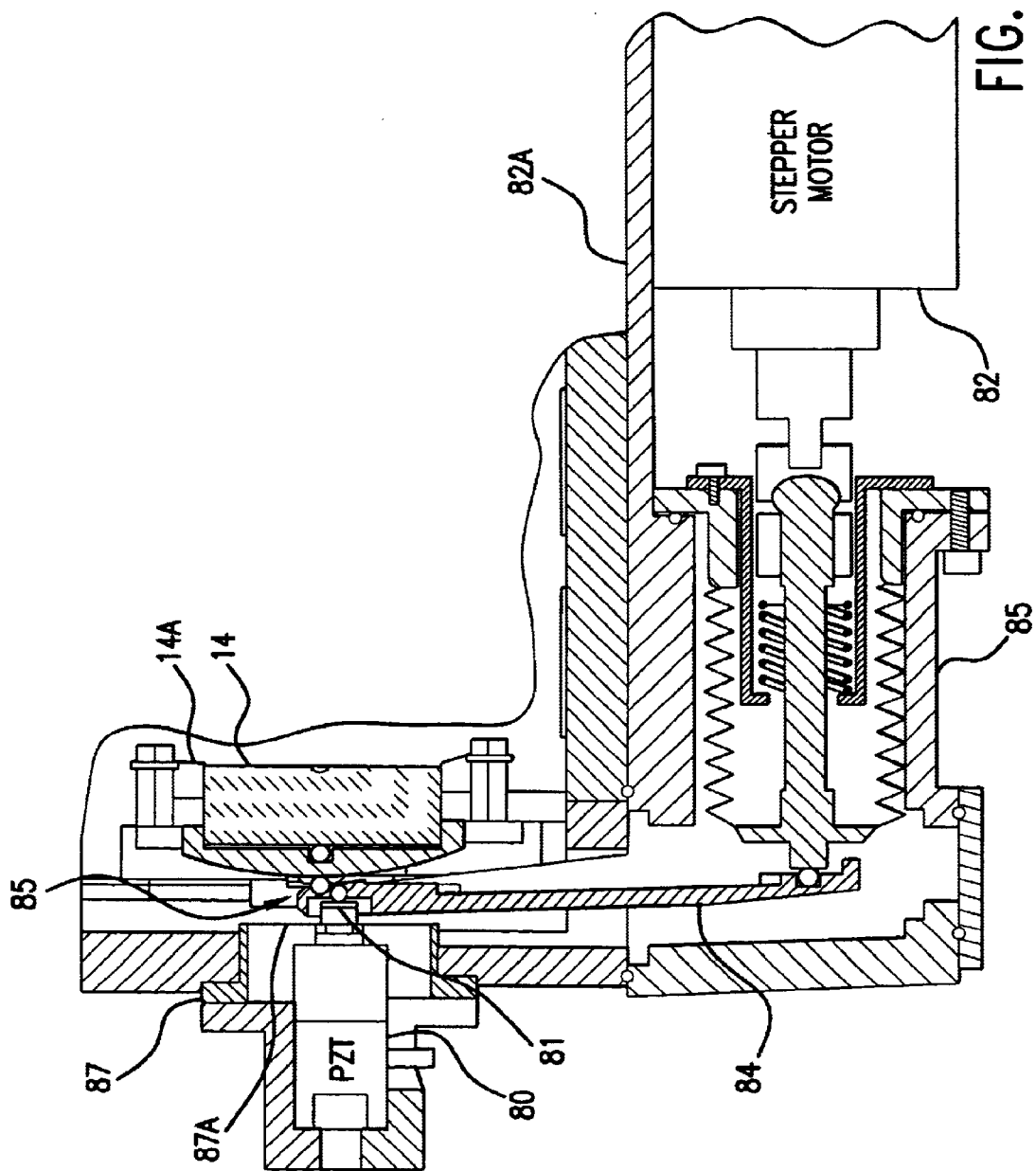

FIGS. 8A, B and C show a preferred technique for assembly of the etalon unit to assure the oxygen content is within Applicants' preferred range. The parts of the etalon unit are shown in FIG. 9. A cross-section of a completely assembled etalon unit is shown at 184 in FIG. 5. The principal components of the unit are:

Mounting base 60

Housing 62

Exit Lens 64

Mounting Shell 66

Aperature 68

Entrance Window 70

The etalon itself is comprised of two fused silica plates each mounting within mounted shell 66 with three glue spots, two of which are shown for each plate on shell 66. The plates are held apart from each other a very small distance with three low thermal expansion spacers which could be ULE glass available from Corning Glasxs or Zerodure glass available from Shott Glass. The plates 67 are shown in the cross-section drawing of the etalon 184 in FIG. 5.

In a preferred embodiment of the present invention the following procedure is followed to assure that the gas sealed within the etalon housing 62 contains about 2 percent oxygen. The etalon components are partially assembled by assembling parts 60, 61, and 62, and part 64 is placed inside the assembled portion. All parts shown in the set in FIG. 9 along with 19 other sets of parts are place in a bake dish and baked in oven 80 for 12 to 24 hours at 80° C., then cooled down slowly to room temperature. The oven is opened and the bake dish is covered and moved into adjacent transfer box 82. While the parts are being baked glove box 84 as shown in FIG. 12A is prepared for the assembly by purging the box, first with pure $N_2$ and then with a 80–20 mixture of $N_2$ and $O_2$ until $O_2$ monitor 86 confirms that the $O_2$ concentration is within the range of 1.6 percent and 2.4 percent. The exhaust from glove box 84 passes into transfer box 82 so that the oxygen concentration is that box is close to that of glove box 84.

Improved Wavemeter Purge

In a preferred embodiment a special $N_2$ purge technique is used to provide extra purging of the high ultraviolet flux portions of the wavemeter as well as the output coupler and the chamber output window block. This technique is shown in FIG. 7. As explained above the laser output beam intersects partially reflecting mirror 170 which passes 95% of the energy in the beam as an output beam. About 4% of the reflected beam is reflected from mirror 171 to energy detector 172 where the pulse energy is measured. (The other part of the reflected beam passes through mirror 171 as shown at 61A and goes to other monitors in the wave meter.) At 4,000 Hz this 5% of the output energy represents a lot of UV light so special care has been taken to assure that the gas in the path of this portion of the beam is very clean and pure. To do this the wavemeter is modified to seal the region between the upstream side of mirror 170, the upstream side of mirror 171 and the front side of the window of detector 172 from the rest of the wavemeter. And a special purge flow to and from this region is provided as shown at 62A. The remainder of the wavemeter is purged by a second purge flow shown at 64A which first purges energy detector 172. The exhaust from energy detector 172 is into the wavemeter to purge the remainder of the wavemeter optics which are subject to much less intense ultraviolet flux than the high intensity portion.

The purge flow 62A is confined in the wavemeter by seals at mirrors 170, 171 and the 172 detector window. The purge flow exits this region along the laser output beam path through a bellows region 66A back to the output coupler module 68A to purge it. The flow then flows through bellows unit 70A and into window block 72A, out through an exit port in the window block and an exit port in bellows unit 70A then back through tube 74A to an $N_2$ purge module.

Shutter Purge

The downstream side of window 170 is purged with purge flow from shutter module 5K. The purge flow may be from module 17 as shown in FIG. 7 or in some cases window 76A is removed and the output of shutter module is openly connected with a purged customer beam line.

Various modifications may be made to the present invention without altering its scope. Those skilled in the art will recognize many other possible variations. For example, ground glass diffusers 181G and 181R could be replaced by a defractive diffuser, if so care must be taken to assure that the two diffusers are compatible and do not themselves produce unwanted patterns or narrow the beam too much. For example, oxidizers other than oxygen could be used to keep the beam path clean of carbon deposits. Accordingly, the above disclosure is not intended to be limiting and the scope of the invention should be determined by the appended claims and their legal equivalents.

We claim:

1. An ultraviolet laser wavemeter with enhanced illumination comprising:

A. a beam splitter for extracting a portion of a laser beam from an ultraviolet laser said portion comprising two spatially separated beams each reflecting from a separate surface of said beam splitter;

B. a defractive diffuser;

C. reducing optics for reducing size of said two spatially separated beams and directing the two reduced beams so as to illuminate said defractive diffuser to produce a merged diffuse beam at an exit surface of said defractive diffuser;

D. a second diffuser;

E. imaging optics for imaging a portion of said merged diffuse beam on to a second diffuser to produce a first twice diffused merged beam at an exit surface of said second diffuser;

F. an etalon positioned to be illuminated by said first twice diffused merged beam so as to produce interference fringes;

G. a fringe detector and focusing optics for focusing output beams from said etalon onto said fringe detector; and H. a processor programmed with an algorithm for calculating spectral characteristics of said laser beam based on fringe information produced by said fringe detector.

2. A wavemeter as in claim 1 and further comprising a calibration unit comprising light absorbing elements having an absorption line at a known wavelength near an operating wavelength of said ultraviolet laser.

3. A wavemeter as in claim 2 and further comprising a third diffuser substantially equivalent to said second diffuser wherein said imaging optics is configured to image portions of said merged diffuse beam on to both said second diffuser and said third diffuser, said third diffuser producing at its exit surface a second twice diffused merged beam.

4. A wavemeter as in claim 3 and further comprising:

A. directing optics for directing said second twice diffused merged beam to illuminate said light absorbing elements;

B. a detector for detecting portions of said second twice diffused beam passing through said light absorbing elements;

C. a wavelength tuning means for tuning said laser beam across said absorption line of said light absorbing elements wherein said wavemeter is calibrated by recording etalon fringe information when said second twice diffused merged beam suffers a maximum absorption by said absorbing elements and relating said etalon fringe information to said known absorption line.

5. A wavemeter as in claim 1 and further comprising a slit aperture optically positioned between said second diffuser and said etalon.

6. A wavemeter as in claim 1 wherein said reducing optics comprises two spaced apart lenses.

7. A wavemeter as in claim 3 wherein said imaging optics comprises a beam splitter for converting said merged diffused beam into two portions.

8. A wavemeter as in claim 1 and further comprising a pulse energy monitor.

9. A wavemeter as in claim 1 and further comprising a purge means for purging at least portions of said wavemeter.

10. A wavemeter as in claim 1 wherein said wavemeter is configured to monitor spectral properties of an argon fluoride excimer laser.

11. A wavemeter as in claim 1 wherein said wavemeter is configured to monitor spectral properties of a krypton fluoride laser.

12. A wavemeter as in claim 10 wherein said absorbing elements comprises platinum vapor.

13. A wavemeter as in claim 1 wherein said fringe detector comprises a photodiode array.

14. A wavemeter as in claim 13 and also comprising a grating configured to produce fringes on a portion of said array to provide a coarse measurement of wavelength.

15. A wavemeter as in claim 1 wherein said processor is configured to complete calculations of said spectral characteristics at rates greater than 2000 times per second.

* * * * *